United States Patent
Wei et al.

(10) Patent No.: US 11,175,316 B2
(45) Date of Patent: Nov. 16, 2021

(54) METHOD FOR IDENTIFYING THE TYPE OF A GRID AUTOMATICALLY AND INVERTER DEVICE THEREOF

(71) Applicant: Delta Electronics (Shanghai) Co., Ltd., Shanghai (CN)

(72) Inventors: Qikang Wei, Shanghai (CN); Feidong Xu, Shanghai (CN); Xuancai Zhu, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 62 days.

(21) Appl. No.: 16/734,428

(22) Filed: Jan. 6, 2020

(65) Prior Publication Data

US 2020/0264215 A1 Aug. 20, 2020

(30) Foreign Application Priority Data

Feb. 18, 2019 (CN) .......................... 201910123457.4

(51) Int. Cl.
*H02J 3/38* (2006.01)
*G01R 19/165* (2006.01)
*G01R 31/42* (2006.01)
*H02H 3/32* (2006.01)

(52) U.S. Cl.
CPC . *G01R 19/16547* (2013.01); *G01R 19/16528* (2013.01); *G01R 31/42* (2013.01); *H02H 3/325* (2013.01); *H02J 3/38* (2013.01); *H02J 2300/24* (2020.01)

(58) Field of Classification Search
CPC ...... H02J 2300/24; H02J 3/38; H02J 2300/26; H02J 2300/22; G01R 19/16528
See application file for complete search history.

(56) References Cited

U.S. PATENT DOCUMENTS

| | | | | |
|---|---|---|---|---|
| 5,631,554 A | * | 5/1997 | Briese | .................... G01R 35/04 324/76.77 |
| 6,112,158 A | * | 8/2000 | Bond | .................... G06Q 50/06 702/61 |
| 7,352,549 B1 | * | 4/2008 | Greizer | .................... H02J 3/383 361/85 |
| 8,823,356 B2 | | 9/2014 | Chapman | |
| 2002/0085325 A1 | * | 7/2002 | Suzui | .................... H02J 3/383 361/42 |
| 2012/0089354 A1 | * | 4/2012 | Holdsclaw | .......... G01R 21/133 702/64 |

(Continued)

Primary Examiner — Harry R Behm
(74) Attorney, Agent, or Firm — CKC & Partners Co., LLC

(57) ABSTRACT

A method for identifying type of a grid automatically and an inverter device thereof are provided. The inverter device comprises a power line L1, a power line L2, a neutral line N and a ground line electrically connectable to a first power line, a second power line, a neutral line and a ground line of the grid, respectively. The method comprises: sampling at least two of voltages between L1 and L2, between L1 to N and between L2 to N when the two neutral lines are connected, and identifying the type of the grid based on the sampling result; and sampling the voltage between L1 and L2 when the two neutral lines are not connected, sampling at least one of a voltage between L1 and GND and between L2 and GND with cooperation of a grid-connected switching unit, and identifying the type of the grid based on the sampling results.

18 Claims, 6 Drawing Sheets

(56) References Cited

U.S. PATENT DOCUMENTS

| | | | |
|---|---|---|---|
| 2017/0237262 A1* | 8/2017 | Geng | H02J 3/14 307/84 |
| 2017/0264212 A1 | 9/2017 | Muguerza Olcoz et al. | |
| 2018/0026550 A1* | 1/2018 | Dent | H02J 3/381 363/56.01 |
| 2018/0191270 A1 | 7/2018 | Correa Vasquez et al. | |

* cited by examiner

METHOD FOR IDENTIFYING THE TYPE OF A GRID AUTOMATICALLY AND INVERTER DEVICE THEREOF

CROSS-REFERENCE TO RELATED APPLICATIONS

This non-provisional application claims priority under 35 U.S.C. § 119(a) on Patent Application No. 201910123457.4 filed in P.R. China on Feb. 18, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present application relates to a method of automatically identifying the type of a grid and an inverter device thereof.

BACKGROUND ART

Generally, there are two types of low-voltage power grids in the United States, for example, 240V grid and 208V grid. Before the inverter is connected to a grid, the professional personnel are usually required to identify the type of the grid in advance. In addition, the respective protection and control parameters of the two different types of grids are different. So when the type of the grid connected with the inverters are changed, professional personnel are required to reset control parameters, protection parameters and other parameters according to the type of the grid. Wherein, the process of manual operation is complicated, especially when the number of grid-connected inverters is large, which is time-consuming and laborious.

Therefore, there is an urgent need for a method that can automatically identify the type of a grid, which can reduce the operations of manually setting a grid type for the grid-connected inverter device.

DISCLOSURE OF THE PRESENT APPLICATION

In light of this, it is an object of the present application to provide a method for identifying the type of a grid automatically and an inverter device thereof, which can reduce manual operations for setting a grid type when the inverter device is connected to the grid, so that the process of the inverter device connected to the grid is more intelligent.

In order to achieve the above object, the present application provides a method for an inverter to identify the type of a grid automatically, wherein the inverter device comprises a first power line L1, a second power line L2, a neutral line N and a ground line PE that can be electrically connected to a first power line L1', a second power line L2', a neutral line N' and a ground line PE' of the grid, respectively, wherein the method comprises:

when the neutral line N of the inverter device and the neutral line N' of the grid are connected, sampling at least two of voltages between the first power line L1 and the second power line L2, between the first power line L1 and the neutral line N and between the second power line L2 and the neutral line N of the inverter device and identifying whether the grid is a first type or a second type of grid based on the sampling result; and when the neutral line N of the inverter device and the neutral line N' of the grid are not connected, sampling a voltage between the first power line L1 and the second power line L2, and sampling at least one of a voltage between the first power line L1 and a control ground line GND and between the second power line L2 and the control ground line GND of the inverter device with cooperation of a grid-connected switching unit, and identifying whether the grid is a first type or a second type of grid based on the sampling result.

In order to achieve the above object, the present application further provides an inverter device, wherein the inverter device has a plurality of output terminals that correspond to a first power line L1, a second power line L2, a neutral line N and a ground line PE, respectively, and can be electrically connected to a first power line L1', a second power line L2', a neutral line N' and a ground line PE' of the grid, respectively, when the inverter device is connected to the grid, wherein the inverter device comprises:

a main inverter unit configured to convert a DC voltage to an AC voltage;

a grid-connected switching unit electrically coupled between the main inverter unit and the plurality of output terminals;

a control unit controlling the main inverter unit; wherein the control unit comprises:

an identification unit configured to:

sample at least two of voltages between the first power line L1 and the second power line L2, between the first power line L1 and the neutral line N and between the second power line L2 and the neutral line N of the inverter device when the neutral line N of the inverter device and the neutral line N' of the grid are connected, and identify whether the grid is a first type or a second type grid based on the sampling result; and sample a voltage between the first power line L1 and the second power line L2 when the neutral line N of the inverter device and the neutral line N' of the grid are not connected, sample at least one of a voltage between the first power line L1 and a control ground line GND and between the second power line L2 and the control ground line GND of the inverter device with cooperation of the grid-connected switching unit, and identify whether the grid is a first type or a second type grid based on the sampling result.

In order to achieve the above object, the present application provides another method for an inverter to identify the type of a grid automatically, wherein the inverter device comprises a first power line L1, a second power line L2, a neutral line N and a ground line PE that can be electrically connected to a first power line L1', a second power line L2', a neutral line N' and a ground line PE' of the grid, wherein the method comprises:

sampling a voltage between the first power line L1 and the second power line L2, obtaining at least one of an instantaneous voltage $u_{L1GN}$ between the first power line L1 and a control ground line GND and an instantaneous voltage $u_{L2GND}$ between the second power line L2 and the control ground line GND with cooperation of a grid-connected switching unit, and identifying whether the grid is a first type or a second type of grid based on at least one of the instantaneous voltage $u_{L1GN}$ and the instantaneous voltage $u_{L2GND}$.

Hereinafter, the above description will be described in detail with reference to implementations, and a further explanation of the technical solution of the present application will be provided.

BRIEF DESCRIPTION OF THE DRAWINGS

To make the above and other objects, features, advantages and embodiments of the present application more apparent and straightforward, a brief description of the drawings is provided as follows.

EMBODIMENTS

Figure 1:
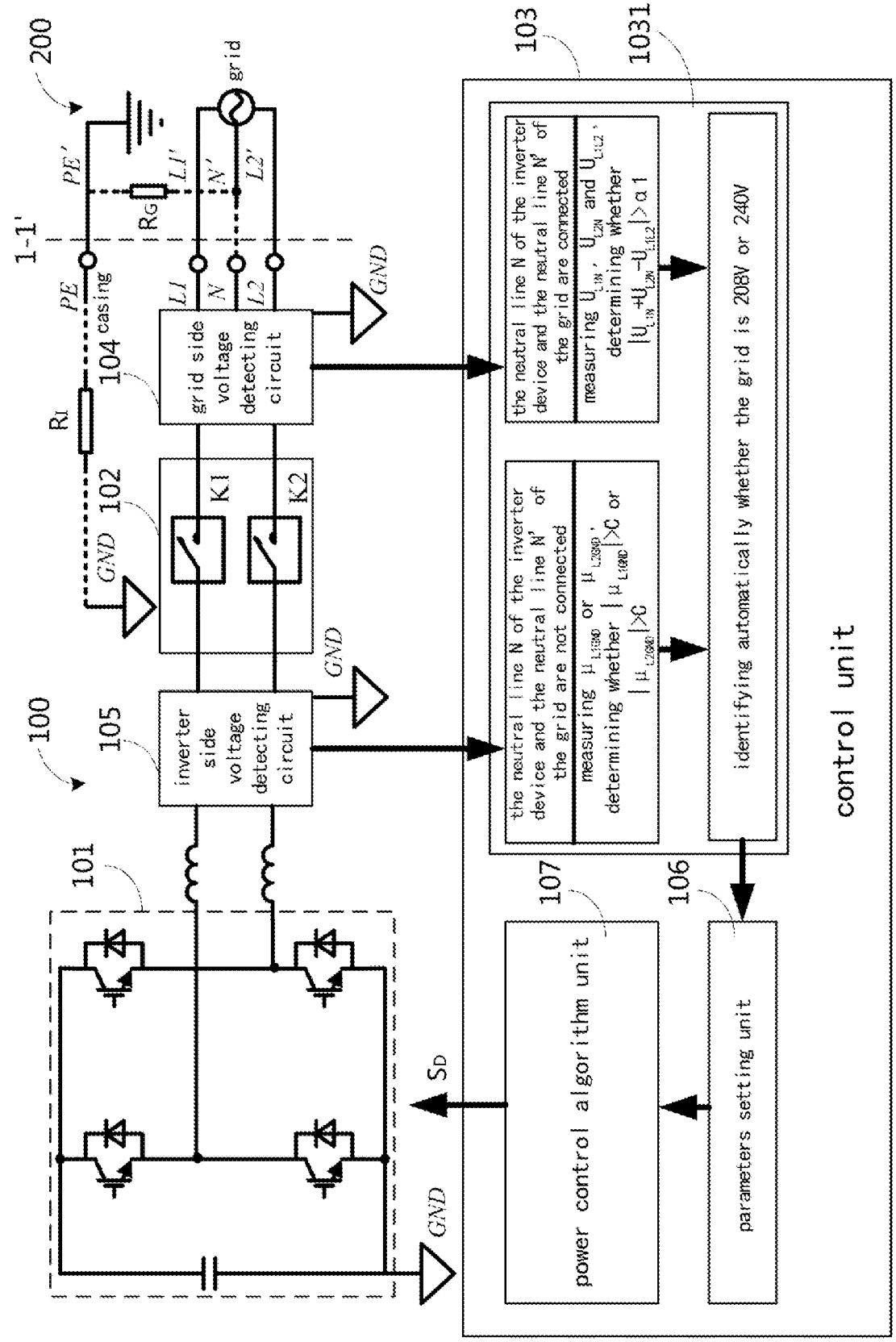
FIG. 1 is a schematic structural diagram of an inverter device according to the present application.

In order to make the description of the present application more elaborate and complete, reference may be made to the accompanying drawings and the various embodiments described below, and the same numerals in the drawings represent the same or similar components. On the other hand, well-known components and steps are not described in the embodiments to avoid unnecessary limitation of the present application. In addition, for the sake of simplicity of the drawings, some of the conventional structures and elements already known will be shown in simplified illustration in the drawings.

FIG. 1 is a schematic structural diagram of an inverter device. In the embodiment shown in FIG. 1, the inverter device 100 of the present application includes a main inverter unit 101, a filtering unit, a grid-connected switching unit 102, and a control circuit 103. Moreover, the inverter device 100 has a plurality of output terminals that correspond to a first power line L1, a second power line L2, a neutral line N and a ground line PE, respectively, for example, an L1 output terminal, an L2 output terminal, an N output terminal and a PE output terminal, respectively, which can be electrically connected to a first power line L1', a second power line L2', a neutral line N' and a ground line PE' of a grid 200, respectively. As shown in FIG. 1, the inverter device 100 is on the left side of the dashed line 1-1', and the grid 200 is on the right side. When the inverter device need to be connected with the grid, the first power line L1, the second power line L2, the neutral line N and the ground line PE of the inverter device 100 can be electrically connected to the first power line L1', the second power line L2', the neutral line N' and the ground line PE' of the grid 200, correspondingly. In the present application, the inverter device 100 may further comprise a casing, and the ground line PE of the inverter device 100 is connected to the casing directly. Generally, there is an insulation impedance $R_I$ between the casing of the inverter device 100 and a control ground line GND of the inverter device 100. The neutral line N' and the ground line PE' of the grid 200 are connected via a very little ground resistance $R_G$.

The main inverter unit 101 realizes the conversion from a DC voltage to an AC voltage. It should be understood that the circuit structure of the main inverter unit 101 is not limited to the circuit shown in FIG. 1, while other circuit topologies can also be adopted. These descriptions are not intended to limit the application. The filtering unit filters voltage and current output by the main inverting unit 101. While the filtering unit shown in FIG. 1 is an L-type filter, it can be understood that other topologies, such as an LCL-type filter, can also be used as the filtering unit, and the descriptions are not intended to limit the application.

The grid-connected switching unit 102 is electrically coupled between the main inverter unit 101 and the plurality of output terminals. The grid-connected switching unit 102 includes at least one relay disposed on the first power line L1 or the second power line L2. The grid-connected switching unit shown in FIG. 1 is composed of two relays K1, K2, which are disposed on the first power line L1 and the second power line L2, respectively. In some embodiments, the grid-connected switching unit 102 may have only one relay K1 disposed on the first power line L1 or the second power line L2. It can be understood that the grid-connected switching unit 102 can also be other type(s) of switch(es), of which the number is not defined and not confined to two as shown in FIG. 1. For example, four or other number can also be contemplated, and these are also not intended to limit the application.

The control circuit 103 is connected with the main inverter unit 101, and controls the main inverter unit 101. The control circuit 103 includes an identification unit 1031. The identification unit 1031 is configured to identify the type of the grid. When the neutral line N of the inverter device 100 and the neutral line N' of the grid 200 are connected, at least two of voltages between the first power line L1 and the second power line L2, between the first power line L1 and the neutral line N, and between the second power line L2 and the neutral line N of the inverter device 100 are sampled, and the grid is identified as a first type grid or a second type grid based on the sampling result. When the neutral line N of the inverter device 100 and the neutral line N' of the grid 200 are not connected, the voltage between the first power line L1 and the second power line L2 of the inverter device is sampled, and at least one of a voltage between the first power line L1 and a control ground line GND and between the second power line L2 and the control ground line GND of the inverter device 100 is sampled with cooperation of the grid-connected switching unit 102, and the grid is identified as a first type grid or a second type grid based on the sampling result. In this embodiment, the first type grid may be, for example, a 208V grid, and the second type grid may be, for example, a 240V grid, but they are not intended to limit the present application.

Figure 2A:
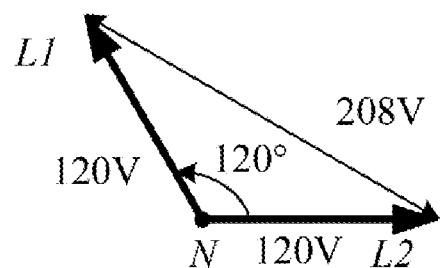
FIG. 2A is a schematic diagram of the voltage vector of a 208V grid according to the present application.
Figure 2B:
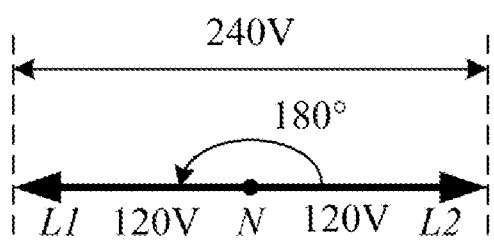
FIG. 2B is a schematic diagram of the voltage vector of a 240V grid according to the present application.

Taking two types of grid of 240V and 208V among the low-voltage grids in the United States as examples, the vector diagrams of the voltage are shown in FIG. 2A and FIG. 2B, respectively. FIG. 2A shows the voltage vector of the 208V grid, and FIG. 2B shows the voltage vector of the 240V grid. Under ideal conditions, the angle between L1N and L2N is 120° for 208V grid, shown in FIG. 2A, and 180° for 240V grid, shown in FIG. 2B. Therefore, according to the vector, the type of the grip can be identified by analyzing two aspects, namely, the vector length or the vector angle, specifically as depicted in conjunction with FIG. 3. However, there are fluctuations in the grid. Considering the fluctuations between 0.88 and 1.1, generally, the normal working range of the 208V grid is from 183V to 228.8V, and the normal working range of the 240V grid is from 211.2V to 264V. Since the normal working ranges of the two grids partially overlap, it is inaccurate to identify the type of the grid just based on the voltage effective value between the lines L1, L2.

According to FIG. 2A and FIG. 2B, in theory, for the first type grid, such as 208V grid, a voltage effective value $U_{L1N}$ between the first power line L1 and the neutral line N is 120V, a voltage effective value $U_{L2N}$ between the second power line L2 and the neutral line N is 120V, a voltage effective value $U_{L1L2}$ between the first power line L1 and the second power line L2 is 208V, and the relationship among the three voltage effective values satisfies:

$$|U_{L1N}+U_{L2N}-U_{L1L2}|=32$$

For the second type grid, such as 240V grid, the voltage effective value $U_{L1N}$ between the first power line L1 and the neutral line N is 120V, the voltage effective value $U_{L2N}$ between the second power line L2 and the neutral line N is 120V, the voltage effective value $U_{L1L2}$ between the first power line L1 and the second power line L2 is 240V, and the relationship among the three voltage effective values satisfies:

$$|U_{L1N}+U_{L2N}-U_{L1L2}|=0$$

Therefore, if $|U_{L1N}+U_{L2N}-U_{L1L2}|=0$, the grid is a 240V grid; if $|U_{L1N}+U_{L2N}-U_{L1L2}|=32$, the grid is a 208V grid.

Therefore, a threshold $\alpha_1$ is set in consideration of the deviation, then when the neutral line N of the inverter device and the neutral line N' of the grid are connected, the principle for identifying a grid may be:

$$|U_{L1N}+U_{L2N}-U_{L1L2}|>\alpha_1$$

That is, when the voltage effective values $U_{L1N}$, $U_{L2N}$ and $U_{L1L2}$ satisfy the formula $|U_{L1N}+U_{L2N}-U_{L1L2}|>\alpha_1$, the grid is a 208V grid (i.e., the first type grid), and when said formula is not satisfied, the grid is a 240V grid (i.e., the second type grid).

Considering the fluctuations of the grid, for example, if the voltage of the 208V grid is reduced by 12% and equal to 183V, then the difference is changed from 32V to 28V. Or even the difference may be less than 28V when the voltage vector of the grid may be unbalanced. Therefore, the present application sets a certain margin according to the actual situation, and an appropriate threshold $\alpha_1$ can be selected between 0 and 28V to accommodate the undesired changes of the grid.

On the other hand, the peak voltage of the grid is $\sqrt{2}$ times of the effective value voltage. So, for the 208V grid, a peak voltage $U_{p-L1N}$ between the first power line L1 and the neutral line N is 120$\sqrt{2}$ V, a peak voltage $U_{p-L2N}$ between the second power line L2 and the neutral line N is 120 $\sqrt{2}$ V, a peak voltage $U_{p-L1L2}$ between the first power line L1 and the second power line L2 is 208 $\sqrt{2}$ V, and the relationship among the three peak voltages satisfies:

$$|U_{p-L1N}+U_{p-L2N}-U_{p-L1L2}|=32\sqrt{2}$$

Similarly, for 240V grid, the peak voltage $U_{p-L1N}$ between the first power line L1 and the neutral line N is 120$\sqrt{2}$ V, the peak voltage $U_{p-L2N}$ between the second power line L2 and the neutral line N is 120 $\sqrt{2}$ V, the peak voltage $U_{p-L1L2}$ between the first power line L1 and the second power line L2 is 240 $\sqrt{2}$ V, and the relationship among the three peak voltages satisfies:

$$|U_{p-L1N}+U_{p-L2N}-U_{p-L1L2}|=0$$

Therefore, if $|U_{p-L1N}+U_{p-L2N}-U_{p-L1L2}|=0$, the grid is a 240V grid; if $|U_{p-L1N}+U_{p-L2N}-U_{p-L1L2}|=32\sqrt{2}$, the grid is a 208V grid.

Therefore, if a threshold $\alpha_2$ is set in consideration of the existence of deviation, then when the neutral line N of the inverter device and the neutral line N' of the grid are connected, the principle for identifying a grid may be:

$$|U_{p-L1N}+U_{p-L2N}-U_{p-L1L2}|>\alpha_2$$

That is, when the peak voltages $U_{p-L1N}$, $U_{p-L2N}$ and $U_{p-L1L2}$ satisfy the formula $|U_{p-L1N}+U_{p-L2N}-U_{p-L1L2}|>\alpha_2$, the grid is a 208V grid (i.e., the first type grid), and when said formula is not satisfied, the grid is a 240V grid (i.e., the second type grid), wherein $\alpha_2=\sqrt{2}\alpha_1$.

On the other hand, in theory, for the 208V grid, double of the voltage effective value $U_{L1N}$ between the first power line L1 and the neutral line N is 240V, the voltage effective value $U_{L1L2}$ between the first power line L1 and the second power line L2 is 208V, and the voltage effective values $U_{L1N}$ and $U_{L1L2}$ satisfy a formula $|2U_{L1N}-U_{L1L2}|=32$; and for the 240V grid, the voltage effective value $U_{L1L2}$ between the first power line L1 and the second power line L2 is 240V, which satisfies $|2U_{L1N}-U_{L1L2}|=0$. Therefore, when double of the voltage effective value $U_{L1N}$ and the voltage effective value $U_{L1L2}$ satisfy a formula $|2U_{L1N}-U_{L1L2}|>\alpha_1$, the grid is the first type grid, and when said formula is not satisfied, the grid is the second type grid. Alternatively, when the voltage effective value $U_{L2N}$ between the second power line L2 and the neutral line N and the voltage effective value $U_{L1L2}$ between the first power line L1 and the second power line L2 satisfy a formula $|2U_{L2N}-U_{L1L2}|>\alpha_1$, the grid is the first type grid, and when said formula is not satisfied, the grid is the second type grid.

Similarly, the peak voltages of the grid are $\sqrt{2}$ times of the effective value voltages. The grid is the first type grid when the peak voltage $U_{p-L1N}$ and the peak voltage $U_{p-L1L2}$ satisfy the formula $|2U_{p-L1N}-U_{p-L1L2}|>\alpha_2$, and the grid is the second type grid when said formula is not satisfied; or the grid is the first type grid when the peak voltage $U_{p-L2N}$ and the peak voltage $U_{p-L1L2}$ satisfy the formula $|2U_{p-L2N}-U_{p-L1L2}|>\alpha_2$, and the grid is the second type grid when said formula is not satisfied.

Figure 4A:
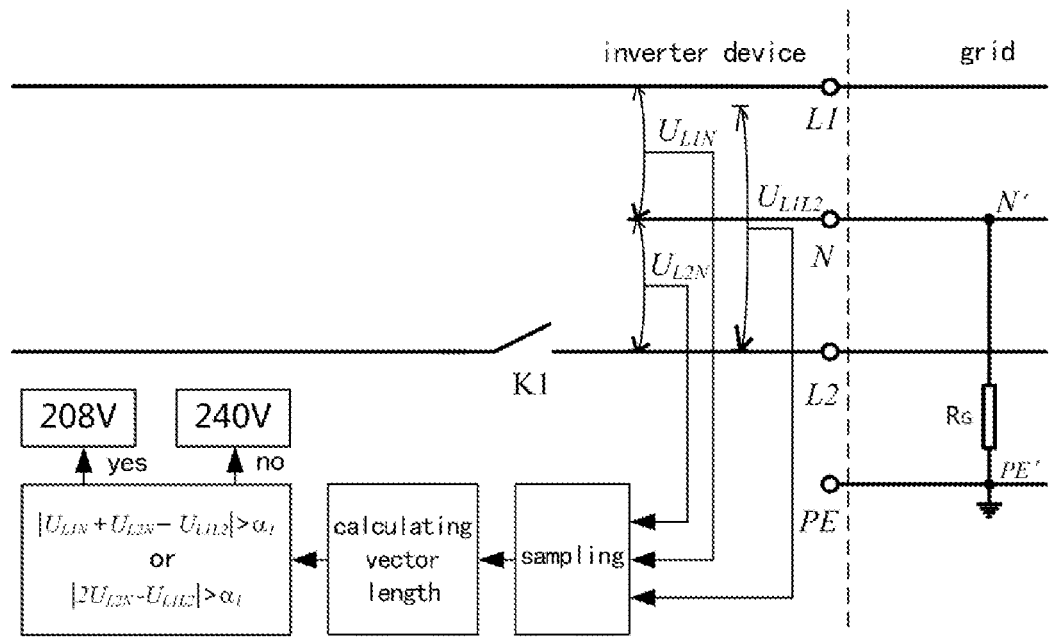
FIG. 4A is a schematic diagram of a method for identifying the type of a grid automatically by a vector length when a neutral line N of an inverter device and a neutral line N' of the grid are connected in the present application.

The various methods described above identify the type of the grid from the vector length of voltage as shown in FIG. 4A. This method need to sample the voltage between the first power line L1 and the second power line L2, and sample at least one of the voltage between the first power line L1 and the neutral line N and between the second power line L2 and the neutral line N. And the relevant voltage vector length, such as $U_{L1L2}$, $U_{L1N}$, $U_{L2N}$ etc., is calculated by effective value calculation or peak value calculation. Then identifying the type of the grid according to the difference in vector length, for example, determining whether $|U_{L1N}+U_{L2N}-U_{L1L2}|>\alpha_1$, $|2U_{L1N}-U_{L1L2}|>\alpha_1$ or the like is satisfied. If satisfied, the grid is the first type grid (e.g., 208V grid); if not satisfied, the grid is the second type grid (e.g., 240V grid).

Figure 4B:
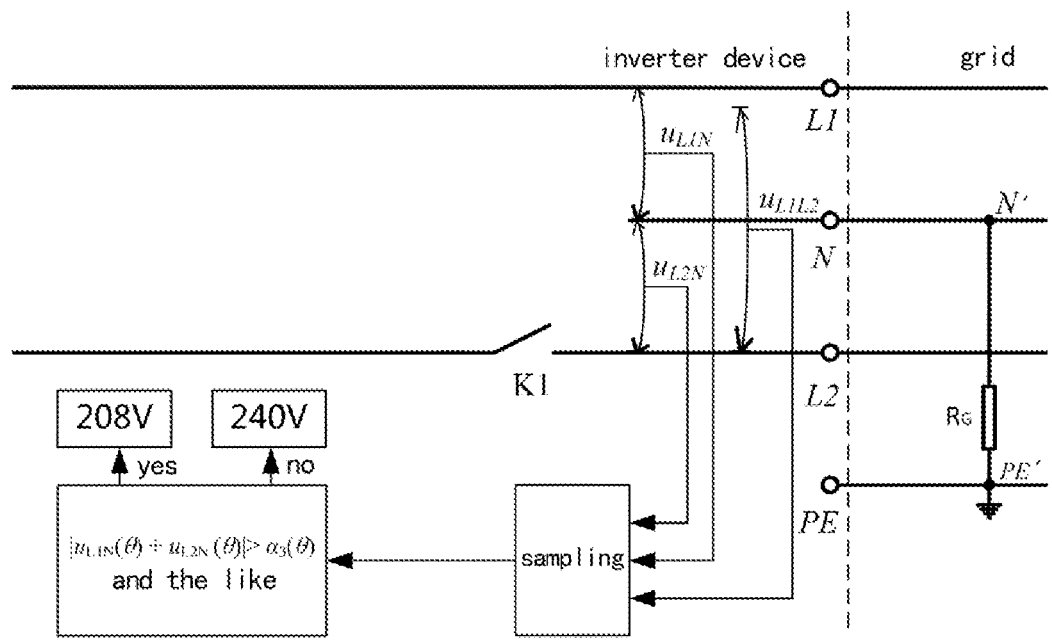
FIG. 4B is a schematic diagram of a method for identifying the type of a grid automatically by an instantaneous voltage when a neutral line N of an inverter device and a neutral line N' of the grid are connected in the present application.

On the other hand, the type of the grid can also be identified from the angle of the voltage vector, as shown in FIG. 4B. For example, at least two of voltages between the first power line L1 and the second power line L2, between the first power line L1 and the neutral line N, and between the second power line L2 and the neutral line N of the inverter device are sampled. For example, an instantaneous voltage $u_{L1N}$ between the first power line L1 and the neutral line N, an instantaneous voltage $u_{L2N}$ between the second power line L2 and the neutral line N, an instantaneous voltage $u_{L1L2}$ between the first power line L1 and the second power line L2, and the like are obtained, and the type of the grid is determined by comparing the difference in instantaneous voltage at a certain moment based on the direction relationship between the voltage vectors.

According to the synthesis relationship between the voltage vectors $\vec{U}_{L1L2}=\vec{U}_{L1N}-\vec{U}_{L2N}$, the instantaneous voltage $u_{L1L2}$ of the synthesized vector is equal to a difference between the two vector instantaneous voltages $u_{L1N}$, $u_{L2N}$, that is, $u_{L1N}-u_{L2N}=u_{L1L2}$ is satisfied. Therefore, the relationship among the three vector voltages can be decoupled into a relationship between the instantaneous voltages $u_{L1N}$, $u_{L2N}$. For the 240V grid, the instantaneous values $u_{L1N}$, $u_{L2N}$ always satisfy $u_{L1N}+u_{L2N}=0$. For the 208V grid, the instantaneous values $u_{L1N}$, $u_{L2N}$ satisfy $u_{L1N}(\theta)+u_{L2N}(\theta)=\alpha(\theta)$, the value of $\alpha(\theta)$ is associated with the selected instantaneous angle $\theta$. Further, and the formula can be written as $a(\theta)=120\sqrt{2}\cos(\theta+60°)+120\sqrt{2}\cos(\theta-60°)$. For example, in case of the time of a zero-crossing point of $u_{L1L2}$, i.e., $\theta=0°$, then $\alpha(0°)=120\sqrt{2}$ V; for example, in case of angle $\theta$ of $u_{L1L2}$ is 60°, i.e., $\theta=60°$, then $\alpha(60°)=60\sqrt{2}$ V.

Likewise, considering the fluctuation of the grid voltage and other non-ideal conditions, and different thresholds $\alpha_3(\theta)$ can be set according to different time points or instantaneous angles. The grid is a 208V grid when the formula $|u_{L1N}(\theta)+u_{L2N}(\theta)|>\alpha_3(\theta)$ is satisfied, and the grid is a 240V grid when said formula is not satisfied, where the threshold $\alpha_3(\theta)$ can be set between 0 and $0.88*\alpha(\theta)$.

Specifically, the angle of $\theta=0°$ is taken as an example. At this time point, the instantaneous voltage $u_{L1L2}$ between the first power line L1 and the second power line L2 is 0. Theoretically, at this time, $\alpha(0°)=u_{L1N}(0°)+u_{L2N}(0°)=120\sqrt{2}$ V for the 208V grid, and $\alpha(0°)=u_{L1N}+u_{L2N}=0$V for the 240V grid. Therefore, the type of the grid can be identified by determining whether the absolute value $|u_{L1N}+u_{L2N}|$ of the sum of the instantaneous voltage $u_{L1N}$ and the instantaneous voltage $u_{L2N}$ is greater than a threshold $\alpha_3(0°)$. The grid is the first type grid (such as the 208V grid) when satisfied, and the grid is the second type grid (such as the 240V grid) when not satisfied. Considering the fluctuation of the grid voltage and the existence of errors, the present application selects an appropriate threshold $\alpha_3(0°)$ according to the actual situation to accommodate the undesired changes of the grid. In some embodiments, the threshold $\alpha_3(0°)$ may be selected to be 100V. In some other embodiments, for the angle of $\alpha=60°$, $\alpha(60°)=u_{L1N}(60°)+u_{L2N}(60°)=60\sqrt{2}$ V for the 208V grid, and $\alpha(60°)=u_{L1N}+u_{L2N}=0$V for the 240V grid. The present application can select a suitable threshold $\alpha_3(60°)$ according to the actual situation, so that the grid is the first type grid (such as the 208V grid) when the formula is satisfied, and the grid is the second type grid (such as the 240V grid) when the formula is not satisfied.

It should be noted that, among the above methods to identify the grid type, the time of the instantaneous angle $\theta\pm90°$ must be excluded, because at this time, the instantaneous voltage $u_{L1L2}$ is at the maximum value, and the instantaneous voltages $u_{L1N}$ and $u_{L2N}$ are equal in magnitude and opposite in direction, satisfying $u_{L1N}+u_{L2N}=0$. In other cases, the above formula can be applied to identify the grid type, except for $\theta=\pm90°$.

Based on the above formula $u_{L1N}(\theta)+u_{L2N}(\theta)=\alpha(\theta)$, other formulae can be derived, for example, by substituting it into the formula $u_{L1N}-u_{L2N}=u_{L1L2}$, then transformations $2u_{L1N}(\theta)-u_{L1L2}(\theta)=\alpha(\theta)$ and $u_{L1L2}(\theta)-2u_{L2N}(\theta)=\alpha(\theta)$ can be derived.

Further, according to modification of the above formulae, the type of the grid can also be identified by determining whether the maximum values of $u_{L1N}(\theta)$ and $u_{L2N}(\theta)$ are greater than $\alpha(\theta)/2$, that is, the formula is $\max(u_{L1N}(\theta), u_{L2N}(\theta))>\alpha(\theta)/2$ and so on.

It should be noted that the present application does not limit the above calculation formulae among voltages, and all the ways of identifying the grid types by comparisons among the voltages should fall within the protection scope of the present application.

Therefore, in the present application, the inverter device 100 may further comprise a grid side voltage detecting circuit 104 coupled between the plurality of output terminals and the grid-connected switching unit 102, and electrically connected to the control ground line GND of the inverter device 100. Specifically, as shown in FIG. 1, when the neutral line N of the inverter device 100 and the neutral line N' of the grid 200 are connected, at least two of voltages between the first power line L1 and the second power line L2, between the first power line L1 and the neutral line N, and between the second power line L2 and the neutral line N of the inverter device may be sampled by the grid side voltage detecting circuit 104. Then the identification unit 1031 can calculate and obtain the effective values or peak values or instantaneous values of the sampled voltages. After a certain comparison, the type of the grid can be identified, for example, the grid is identified automatically as 208V or 240V.

However, if the neutral line N of the inverter device and the neutral line N' of the grid are not connected, the grid side voltage detecting circuit cannot detect the voltage between the first power line L1 and the neutral line N and the voltage between the second power line L2 and the neutral line N. Therefore, in the present application, the type of the grid can be further identified by the cooperation of an inverter side voltage detecting circuit 105 and the grid-connected switching unit 102. Specifically, in the present application, the inverter side voltage detecting circuit 105 is coupled between the main inverter unit 101 and the grid-connected switching unit 102, and is electrically connected to the control ground line GND of the inverter device 100. The voltage between the first power line L1 and the second power line L2 on the grid side is sampled by the grid side voltage detecting circuit 104. Meanwhile, the inverter side voltage detecting circuit 105 constructs at least a loop with cooperation of the grid-connected switching unit 102 to detect voltage between the first power line L1 and a control ground line GND or a voltage between the second power line L2 and the control ground line GND, and then the identification unit 1031 can identify the type of the grid according to the sampling result.

Figure 5:
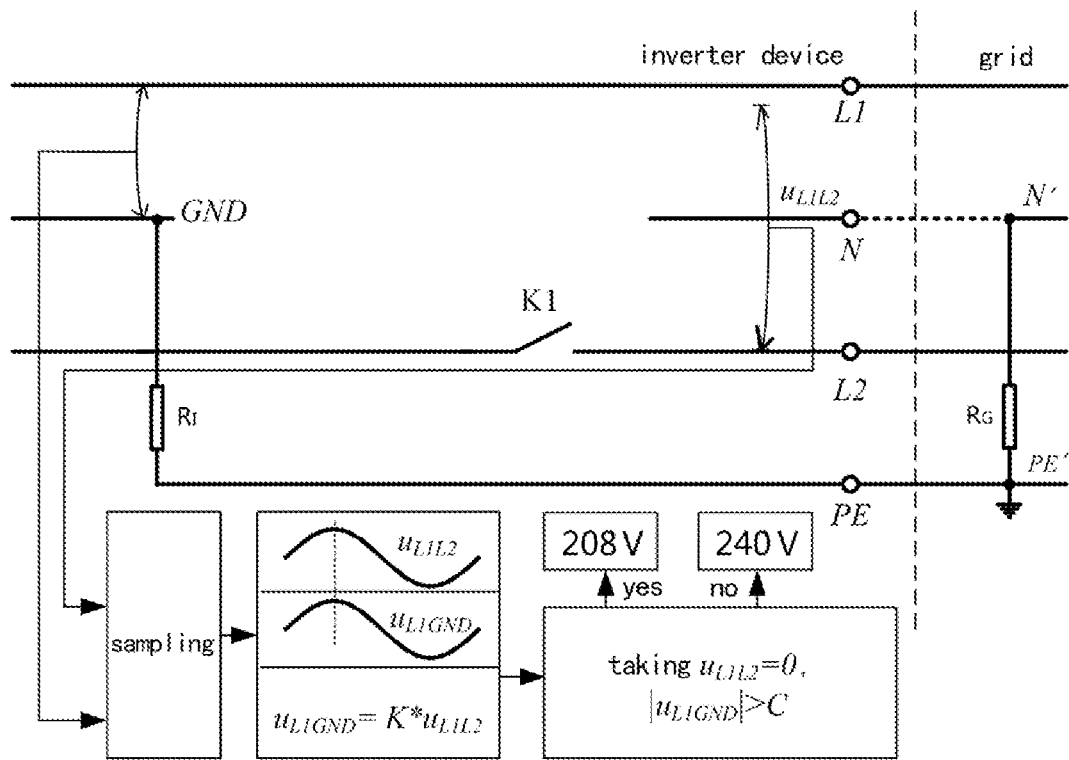
FIG. 5 is a schematic diagram of a method for identifying the type of a grid automatically when a neutral line N of an inverter device and a neutral line N' of the grid are not connected in the present application.
Figure 6:
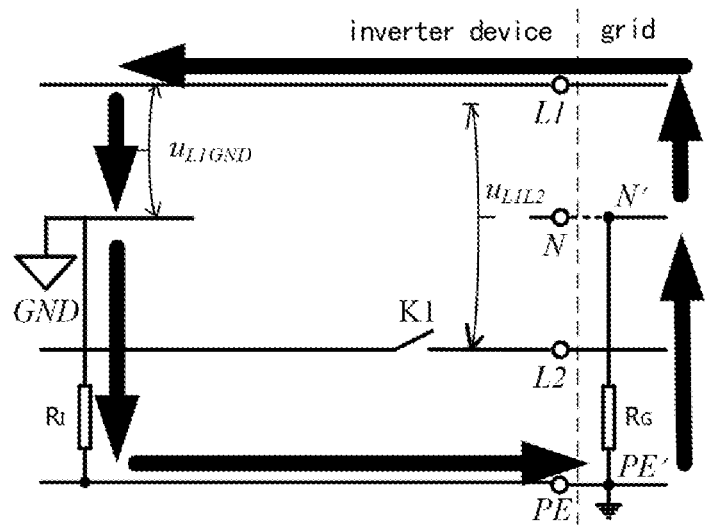
FIG. 6 is a schematic diagram of a first loop constructed in FIG. 5.

In the present application, the voltage between the first power line L1 and the second power line L2 of the inverter device can be sampled with a reference of the instantaneous voltage $u_{L1L2}$ at certain time. In some embodiments, as shown in FIG. 1 in combination with FIGS. 5 and 6, wherein FIG. 6 shows the loop constructed in FIG. 5. In some embodiment, the grid-connected switching unit only has one relay K1, and the relay K1 is located on the second power line L2 shown in FIG. 5. When the relay K1 is disconnected, a loop can be constructed from the first power line L1 of the inverter device 100, the control ground line GND, the ground line PE' of the grid 200, the neutral line N' of the grid 200 and the first power line L1 in sequence, as indicated by the thick arrow in FIG. 6.

The voltage $u_{L1GND}$ between the first power line L1 and the control ground line GND is sampled by the inverter side voltage detecting circuit 105 with the reference of instantaneous voltage $u_{L1L2}$ at zero-crossing point, wherein $u_{L1GND}=K*u_{L1N}$ can be obtained according to an equivalent relationship, where K is a coefficient and 0<K<1. As described above, when the instantaneous voltage $u_{L1L2}=0$, for the 208V grid, $u_{L1N}=60\sqrt{2}$ and $u_{L1GND}=K*60\sqrt{2}$; and for the 240V grid, $u_{L1GND}=K*u_{L1N}=0$. Therefore, in some embodiments, the identification can be designed $|u_{L1GND}|>C$. When the condition is met, the grid is a 208V grid, and the grid is a 240V grid when the condition is not met, where C is a threshold. Considering fluctuations, errors, and certain margins of a grid, C may be chosen between 0 and K*74.6V.

Similarly, when the relay K1 is located on the first power line L1, a loop can be constructed when the relay K1 is disconnected, and the instantaneous voltage $u_{L2GND}$ between the second power line L2 and the control ground line GND is sampled by the inverter side voltage detecting circuit 105, wherein $u_{L2GND}=K*u_{L2N}$ can be obtained according to the equivalent relationship, where K is a coefficient and 0<K<1. Similar to the above methods, the type of the grid can be determined based on the instantaneous voltages $u_{L2GND}$ with reference of instantaneous voltages $u_{L1L2}$.

Figure 7:
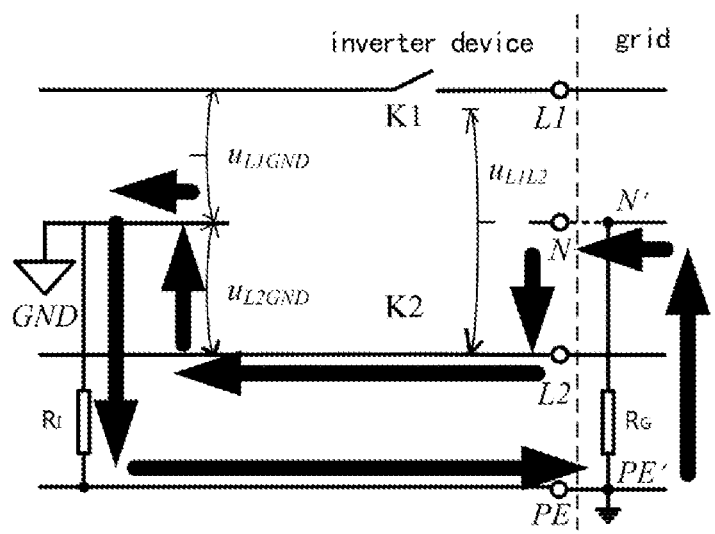
FIG. 7 is a schematic diagram of a second loop constructed by a grid-connected switching unit of another embodiment when a neutral line N of an inverter device and a neutral line N' of the grid are not connected in the present application.

In other embodiments, as shown in FIGS. 1 and 7, the grid-connected switching unit of the inverter device may have two relays, including the relay K1 on the first power line L1 and a relay K2 on the second power line L2, and the inverter side voltage can be sampled through the on/off cooperation of relays K1, K2 to identify the grid type. For example, a first loop can be constructed by closing the relay K1 on the first power line L1 and disconnecting the relay K2 on the second power line L2, and the inverter side voltage detecting circuit can sample the instantaneous voltage $u_{L1GND}$; or a second loop can be constructed by closing the relay K2 on the second power line L2 and disconnecting the relay K1 on the first power line L1, and the inverter side voltage detecting circuit can sample the instantaneous voltage $u_{L2GND}$.

Therefore, in the present application, when the neutral line N of the inverter device 100 and the neutral line N' of the grid 200 are not connected, the inverter side voltage detecting circuit 105 samples the instantaneous voltage $u_{L1GND}$ between the first power line L1 and the control ground line GND of the inverter device 100 with reference of instantaneous voltage $u_{L1L2}$ at zero-crossing point, and when the instantaneous voltage $u_{L1GND}$ satisfies the formula $|u_{L1GND}|>C$, the grid is the first type grid (i.e., the 208V grid), where C is a threshold, and the grid is the second type grid (i.e., the 240V grid) when said formula is not satisfied. Alternatively, the inverter side voltage detecting circuit 105 samples the instantaneous voltage $u_{L2GND}$ between the second power line L2 and the control ground line GND of the inverter device 100 with reference of instantaneous voltage $u_{L1L2}$ at a zero-crossing point, and the grid type is determined based on $|u_{L2GND}|>C$, where C is a threshold. That is to say, when the instantaneous voltage $u_{L2GND}$ satisfies the formula $|u_{L2GND}|>C$, the grid is the first type grid (i.e., the 208V grid), and the grid is the second type grid (i.e., the 240V grid) when said formula is not satisfied.

In the present application, as shown in FIG. 1, the inverter device 100 may further comprise a parameter setting unit 106 for setting control, protection parameters and other parameters corresponding to the type of the grid 200. Further, the inverter device 100 may further comprise a power control algorithm unit 107, which is configured to generate driving signal $S_D$ according to power control algorithm by using the corresponding control, protection parameters, and the main inverter unit 101 can be controlled.

Figure 3:
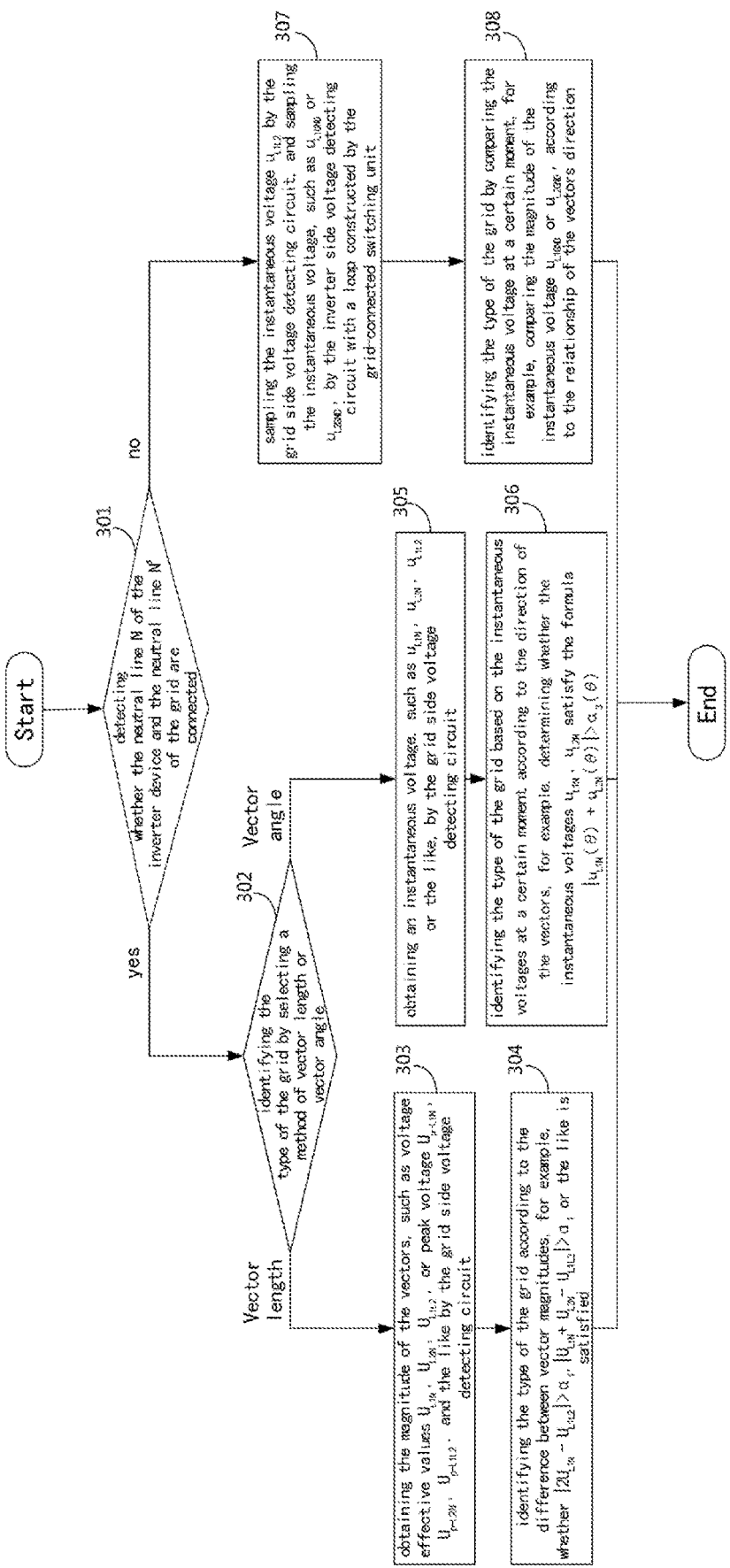
FIG. 3 is a schematic flow diagram of a method of identifying the type of a grid automatically according to an embodiment of the present application.

As shown in FIG. 3, a schematic flow diagram of the method to identify the type of the grid according to an embodiment of the present application is shown. This method includes:

step 301, detecting whether the neutral line N of the inverter device and the neutral line N' of the grid are connected. If connected (i.e., there is a connection), proceed to step 302, and if not (i.e., there is no connection), proceed to step 307.

In this step, whether the neutral line N of the inverter device is connected to the neutral line N' of the grid can be identified by detecting the voltage of the neutral line N of the inverter device. In an embodiment, a resistor may be connected in series between the neutral line N and the first power line L1 or the second power line L2 of the inverter device 100, and a voltage between the neutral line N and the first power line L1 or the second power line L2 of the inverter device 100 may be measured to determine whether the neutral line N of the inverter device 100 is connected to the neutral line N' of the grid 200. Specifically, for example, when the output terminal L1, the output terminal L2, the output terminal N, and the output terminal PE of the inverter are electrically connected to the first power line L1', the second power line L2', the neutral line N', and the ground line PE' of the grid 200, respectively, the voltage on the resistor connected in series between the neutral line N and the second power line L2 of the inverter device is detected. If the neutral line N' of the grid is connected with the neutral line N of the inverter device, a voltage will be detected between the second power line L2 and the neutral line N; if the neutral line N' of the grid is not connected with the neutral line N of the inverter device, the voltage between the second power line L2 and the neutral line N is theoretically 0V. Accordingly, it is possible to determine automatically whether the neutral line N of the inverter device 100 is connected to the neutral line N' of the grid 200.

In some embodiments, whether the neutral line N of the inverter device 100 and the neutral line N' of the grid 200 are connected may be determined by a determining unit (not shown) in the inverter device 100.

In step 302, the type of the grid can be identified by selecting a method of vector length or vector angle. Steps 303 and 304 are carried out when the method of vector length is selected; steps 305 and 306 are carried out when the method of vector angle is selected.

In step 303, obtaining the magnitude of the vectors, such as voltage effective values $U_{L1N}$, $U_{L2N}$, $U_{L1L2}$, or peak voltage $U_{p-L1N}$, $U_{p-L2N}$, $U_{p-L1L2}$, and the like by the grid side voltage detecting circuit.

In some embodiments, the voltage between the first power line L1 and the second power line L2, at least one of the voltage between the first power line L1 and the neutral line N and between the second power line L2 and the neutral line N are sampled by the grid side voltage detecting circuit, and the magnitude of the relevant voltage vector, such as $U_{L1L2}$, $U_{L1N}$, $U_{L2N}$ etc., are obtained by means of a method such as effective value calculation or peak value calculation based on sampling result.

In step 304, identifying the type of the grid according to the difference between vector magnitudes, for example, whether $|2U_{L1N} - U_{L1L2}| > \alpha_1$, $|U_{L1N} + U_{L2N} - U_{L1L2}| > \alpha_1$ or the like is satisfied.

For example, whether the formula $|U_{L1N} + U_{L2N} - U_{L1L2}| > \alpha_1$, $|2U_{L1N} - U_{L1L2}| > \alpha_1$ or the like is satisfied may be determined based on the voltage effective values $U_{L1L2}$, $U_{L1N}$, and $U_{L2N}$. If satisfied, the grid is the first type grid (e.g., a 208V grid); otherwise, the grid is the second type grid (e.g., 240V grid).

In step 305, obtaining an instantaneous voltage, such as $u_{L1N}$, $u_{L2N}$, $u_{L1L2}$ or the like, by the grid side voltage detecting circuit.

In step 306, identifying the type of the grid based on the instantaneous voltages at a certain moment according to the direction of the vectors, for example, determining whether the instantaneous voltages $u_{L1N}$, $u_{L2N}$ satisfy the formula $|u_{L1N}(\theta) + u_{L2N}(\theta)| > \alpha_3(\theta)$. If satisfied, the grid is the first type grid (e.g., a 208V grid); otherwise, the grid is the second type grid (e.g., 240V grid), wherein $\alpha_3(\theta)$ is a threshold associated with the selected instantaneous angle $\theta$.

In step 307, sampling the instantaneous voltage $u_{L1L2}$ by the grid side voltage detecting circuit, and sampling the instantaneous voltage, such as $u_{L1GND}$ or $u_{L2GND}$, by the inverter side voltage detecting circuit with a loop constructed by the grid-connected switching unit.

In some embodiments, the grid side voltage detecting circuit is configured to sample the instantaneous voltage $u_{L1L2}$ between the first power line L1 and the second power line L2 of the inverter device at a certain time point as a reference, and the inverter side voltage detecting circuit is configured to sample at least one of the instantaneous voltage $u_{L1GND}$ between the first power line L1 of the inverter device and the control ground line GND and the instantaneous voltage $u_{L2GND}$ between the second power line L2 and the control ground line GND with a loop constructed by the grid-connected switching unit.

When the neutral line N of the inverter device is not connected to the neutral line N' of the grid, the vector information of the two voltage vectors $u_{L1N}$ and $u_{L2N}$ is difficult to get. Therefore, the present application obtains the instantaneous voltage $u_{L1GND}$ or the instantaneous voltage $u_{L2GND}$ with the cooperation of the grid-connected switching unit 102.

In step 308, identifying the type of the grid by comparing the instantaneous voltage at a certain moment, for example, comparing the magnitude of the instantaneous voltage $u_{L1GND}$ or $u_{L2GND}$, according to the relationship of the vectors direction.

In some embodiments, when the neutral line N of the inverter device 100 is not connected to the neutral line N' of the grid 200, taking the zero-crossing point of the instantaneous voltage $U_{L1L2}$ as the reference. Wherein, when the instantaneous voltage $u_{L1GND}$ satisfies the formula $|u_{L1GND}| > C$ or the instantaneous voltage $u_{L2GND}$ satisfies the formula $|u_{L2GND}| > C$, the grid is the first type grid, such as the 208V grid; and when not satisfied, the grid is the second type grid, such as the 240V grid.

In summary, the present application accordingly provides a method for identifying the type of a grid automatically and an inverter device thereof.

Wherein the inverter device has a first power line terminal L1, a second power line terminal L2, a neutral line terminal N and a ground line terminal PE, which can be electrically connected to the first power line L1', the second power line L2', the neutral line N' and the ground line PE' of the grid, respectively, and the method comprises:

when the neutral line N of the inverter device and the neutral line N' of the grid are connected, sampling at least two of voltages between the first power line L1 and the second power line L2, between the first power line L1 and the neutral line N and between the second power line L2 and the neutral line N of the inverter device, and identifying whether the grid is a first type grid or a second type grid based on the sampling results; and when the neutral line N of the inverter device and the neutral line N' of the grid are not connected, sampling the voltage between the first power line L1 and the second power line L2, and sampling at least one of a voltage between the first power line L1 and a control ground line GND and between the second power line L2 and the control ground line GND of the inverter device with cooperation of a grid-connected switching unit, and identifying whether the grid is a first type grid or second type grid based on the sampling results.

The inverter device provided by the present application as a plurality of output terminals that correspond to a first power line L1, a second power line L2, a neutral line N and a ground line PE, respectively, that can be electrically connected to a first power line L1', a second power line L2', a neutral line N' and a ground line PE' of the grid, respectively, wherein the inverter device comprises:

a main inverter unit configured to convert DC voltage to an AC voltage;

a grid-connected switching unit electrically coupled between the main inverter unit and the plurality of output terminals;

a control unit configured to control the main inverter unit; wherein the control unit comprises:

an identification unit configured to:

sample at least two of voltages between the first power line L1 and the second power line L2, between the first power line L1 and the neutral line N and between the second power line L2 and the neutral line N of the inverter device when the neutral line N of the inverter device and the neutral line N' of the grid are connected, and identify whether the grid is a first type grid or a second type grid based on the sampling result; and sample the voltage between the first power line L1 and the second power line L2 when the neutral line N of the inverter device and the neutral line N' of the grid are not connected, and sample at least one of a voltage between the first power line L1 and a control ground line GND and between the second power line L2 and the control ground line GND of the inverter device by the cooperation of a grid-connected switching unit, and identify whether the grid is a first type grid or a second type grid based on the sampling result.

In the present application, the inverter device may further comprise: a grid side voltage detecting circuit electrically coupled between the plurality of output terminals and the grid-connected switching unit for sampling at least two of voltages between the first power line L1 and the second power line L2, between the first power line L1 and the neutral line N and between the second power line L2 and the neutral line N of the inverter device.

In the present application, the inverter device may further comprise: an inverter side voltage detecting circuit electrically coupled between a main inverter circuit and the grid-connected switching unit and electrically connected to the control ground line GND of the inverter device for sampling at least one of the voltage between the first power line L1 and a control ground line GND and between the second power line L2 and the control ground line GND of the inverter device.

In the present application, the type of a grid can be identified automatically by an inverter device, and the relevant protection and control parameters can be set automatically after the grid type is identified. So it is not necessary to set the operations manually, which make the process of an inverter device connecting to the grid more intelligent.

In the present application, the present application does not need any additional hardware circuit, and can automatically realize the identification of a grid only by a conventional circuit for an inverter. For example, for a single-phase photovoltaic inverter, the conventional hardware circuit includes a grid side voltage detecting circuit, relay(s) (one or two relays disposed on each of the first power line L1 and the second power line L2), and an inverter side voltage detecting circuit, and the present application can identify the type of a grid automatically based on its conventional hardware circuit.

While the present application has been disclosed in the above implementations, they are not intended to limit the present application, and various changes and modifications may be made to the present application by any person skilled in the art without departing from the spirit and scope of the present application. The scope of protection of the present application therefore is subject to the scope defined by the appended claims.

What is claimed is:

1. A method for identifying the type of a grid by an inverter device automatically, wherein the inverter device comprises a first power line L1, a second power line L2, a neutral line N and a ground line PE that can be electrically connected to a first power line L1', a second power line L2', a neutral line N' and a ground line PE' of the grid, respectively, wherein the method comprises:
    detecting a voltage on a resistor connected in series between the neutral line N and the first power line L1 of the inverter device or a voltage on a resistor connected in series between the neutral line N and the second power line L2 of the inverter device, to determine whether the neutral line N of the inverter device is connected to the neutral line N' of the grid;
    when it is determined that the neutral line N of the inverter device and the neutral line N' of the grid are connected, sampling at least two of voltages between the first power line L1 and the second power line L2, between the first power line L1 and the neutral line N and between the second power line L2 and the neutral line N of the inverter device, and identifying the grid as a first type grid or a second type grid based on the sampling result; and
    when it is determined that the neutral line N of the inverter device and the neutral line N' of the grid are not connected, sampling a voltage between the first power line L1 and the second power line L2, and sampling at least one of a voltage between the first power line L1 and a control ground line GND and between the second power line L2 and the control ground line GND of the inverter device with cooperation of a grid-connected switching unit, and identifying the grid as the first type grid or the second type grid based on the sampling result.

2. The method for identifying the type of a grid automatically according to claim 1, wherein the first type of grid is a 208V grid and the second type of grid is a 240V grid.

3. The method for identifying the type of a grid automatically according to claim 1, further comprising:
    when the neutral line N of the inverter device and the neutral line N' of the grid are connected, calculating a voltage effective value $U_{L1N}$ between the first power line L1 and the neutral line N, a voltage effective value $U_{L2N}$ between the second power line L2 and the neutral line N, and a voltage effective value $U_{L1L2}$ between the first power line L1 and the second power line L2 respectively; and
    identifying the grid as the first type grid when the voltage effective values $U_{L1N}$, $U_{L2N}$ and $U_{L1L2}$ satisfy a formula $|U_{L1N}+U_{L2N}-U_{L1L2}|>\alpha_1$, otherwise as the second type grid, wherein $\alpha_1$ is a threshold.

4. The method for identifying the type of a grid automatically according to claim 1, further comprising:
    when the neutral line N of the inverter device and the neutral line N' of the grid are connected, calculating a peak voltage $U_{p-L1N}$ between the first power line L1 and the neutral line N, a peak voltage $U_{p-L2N}$ between the second power line L2 and the neutral line N, and a peak voltage $U_{p-L1L2}$ between the first power line L1 and the second power line L2, respectively; and
    identifying the grid as the first type grid when the peak voltages $U_{p-L1N}$, $U_{p-L2N}$ and $U_{p-L1L2}$ satisfy a formula $|U_{p-L1N}+U_{p-L2N}-U_{p-L1L2}|>\alpha_2$, otherwise as the second type of grid, wherein $\alpha_2$ is a threshold.

5. The method for identifying the type of a grid automatically according to claim 1, further comprising:
    when the neutral line N of the inverter device and the neutral line N' of the grid are connected, calculating a voltage effective value $U_{L1L2}$ between the first power line L1 and the second power line L2, and a voltage effective value $U_{L1N}$ between the first power line L1 and the neutral line N or a voltage effective value $U_{L2N}$ between the second power line L2 and the neutral line N, respectively; and
    identifying the grid as the first type grid when the voltage effective values $U_{L1N}$ and $U_{L1L2}$ satisfy a formula $|2U_{L1N}-U_{L1L2}|>\alpha_1$, otherwise as the second type grid; or,
    identifying the grid as the first type grid when the voltage effective values $U_{L2N}$ and $U_{L1L2}$ satisfy a formula $|2U_{L2N}-U_{L1L2}|>\alpha_1$, otherwise as the second type grid, wherein $\alpha_1$ is a threshold.

6. The method for identifying the type of a grid automatically according to claim 1, further comprising:
    when the neutral line N of the inverter device and the neutral line N' of the grid are connected, calculating a peak voltage $U_{p-L1L2}$ between the first power line L1 and the second power line L2, and calculating a peak voltage $U_{p-L1N}$ between the first power line L1 and the neutral line N or calculating a peak voltage $U_{p-L2N}$ between the second power line L2 and the neutral line N; and identifying the grid as the first type grid when the peak voltages $U_{p-L1N}$ and $U_{p-L1L2}$ satisfy a formula $|2U_{p-L1N}-U_{p-L1L2}|>\alpha_2$, otherwise as the second type grid; or identifying the grid as the first type grid when the peak voltages $U_{p-L2N}$ and $U_{p-L1L2}$ satisfy a formula $|2U_{p-L2N}-U_{p-L1L2}|>\alpha_2$, otherwise as the second type grid, wherein $\alpha_2$ is a threshold.

7. The method for identifying the type of a grid automatically according to claim 1, further comprising:

when the neutral line N of the inverter device and the neutral line N' of the grid are connected, sampling at least two instantaneous voltages of $u_{L1N}$ between the first power line L1 and the neutral line N, $u_{L2N}$ between the second power line L2 and the neutral line N, and $u_{L1L2}$ between the first power line L1 and the second power line L2; and identifying the grid as the first type grid when the instantaneous voltages $u_{L1N}$ and $u_{L2N}$ satisfy a formula $|u_{L1N}(\theta)-u_{L2N}(\theta)|>\alpha_3(\theta)$, otherwise as the second type grid, wherein $\alpha_3(\theta)$ is a threshold associated with the selected instantaneous angle $\theta$.

8. The method for identifying the type of a grid automatically according to claim 7, further comprising:

determining whether the instantaneous voltages $u_{L1N}$ and $u_{L2N}$ satisfy a formula $|u_{L1N}(0°)+u_{L2N}(0°)|>\alpha_3(0°)$ when $\theta=0°$, to identify the grid as the first type grid when said formula is satisfied, otherwise as the second type grid, wherein $\alpha_3(0°)$ is a threshold when $\theta=0°$.

9. The method for identifying the type of a grid automatically according to claim 1, wherein the grid-connected switching unit comprises at least a relay disposed on at least one of the first power line L1 and the second power line L2 of the inverter device;

when the relay is disposed on the second power line L2, disconnecting the relay to construct a loop from the first power line L1 of the inverter device, the control ground line GND, the ground line PE' of the grid, the neutral line N' of the grid and the first power line L1 in sequence, and sampling the voltage between the first power line L1 and the control ground line GND to obtain an instantaneous voltage $U_{L1GND}$ with the reference of the instantaneous voltage $u_{L1L2}$ between the first power line L1 and the second power line L2; or when the relay is disposed on the first power line L1, disconnecting the relay to construct a loop from the second power line L2 of the inverter device, the control ground line GND, the ground line PE' of the grid, the neutral line N' of the grid and the second power line L2 in sequence, and sampling the voltage between the second power line L2 and the control ground line GND to obtain an instantaneous voltage $U_{L2GND}$ with the reference of instantaneous voltage $u_{L1L2}$ between the first power line L1 and the second power line L2.

10. The method for identifying the type of a grid automatically according to claim 9, further comprising:

when the neutral line N of the inverter device and the neutral line N' of the grid are not connected, taking a zero crossing point of the instantaneous voltage $u_{L1L2}$ as a reference, and identifying the grid as the first type grid when the instantaneous voltage $U_{L1GND}$ satisfies $|u_{L1GND}|>C$ or the instantaneous voltage $U_{L2GND}$ satisfies $|u_{L2GND}|>C$, otherwise as the second type grid, wherein C is a threshold.

11. An inverter device comprising a plurality of output terminals that correspond to a first power line L1, a second power line L2, a neutral line N and a ground line PE, and can be electrically connected to a first power line L1', a second power line L2', a neutral line N' and a ground line PE' of the grid, respectively, wherein the inverter device comprises:

a main inverter unit configured to convert a DC voltage to an AC voltage;

a grid-connected switching unit electrically coupled between the main inverter unit and the plurality of output terminals;

a determining unit configured to determine whether the neutral line N of the inverter device and the neutral line N' of the grid are connected or not by measuring a voltage on a resistor connected in series between the neutral line N and the first power line L1 or a voltage on a resistor connected in series between the neutral line N or the second power line L2; and a control unit controlling the main inverter unit; wherein the control unit comprises:

an identification unit configured to:

when the neutral line N of the inverter device and the neutral line N' of the grid are connected, sample at least two of voltages between the first power line L1 and the second power line L2, between the first power line L1 and the neutral line N and between the second power line L2 and the neutral line N of the inverter device, and identify whether the grid is a first type or a second type grid based on the sampling result; and when the neutral line N of the inverter device and the neutral line N' of the grid are not connected, sample a voltage between the first power line L1 and the second power line L2, and sample at least one of a voltage between the first power line L1 and a control ground line GND and between the second power line L2 and the control ground line GND of the inverter device with cooperation of the grid-connected switching unit, and identify whether the grid is a first type or a second type grid based on the sampling result.

12. The inverter device according to claim 11, wherein the first type grid is a 208V grid and the second type grid is a 240V grid.

13. The inverter device according to claim 12, wherein the inverter device further comprises:

a grid side voltage detecting circuit electrically coupled between the plurality of output terminals and the grid-connected switching unit, configured to sample at least two of voltages between the first power line L1 and the second power line L2, between the first power line L1 and the neutral line N and between the second power line L2 and the neutral line N of the inverter device.

14. The inverter device according to claim 12, wherein the inverter device further comprises:

an inverter side voltage detecting circuit electrically coupled between the main inverter circuit and the grid-connected switching unit and electrically connected to the control ground line GND of the inverter device for sampling at least one of a voltage between the first power line L1 and a control ground line GND and between the second power line L2 and the control ground line GND of the inverter device.

15. A method for identifying the type of a grid by an inverter device automatically, wherein the inverter device comprises a first power line L1, a second power line L2, a neutral line N and a ground line PE that can be electrically connected to a first power line L1', a second power line L2', a neutral line N' and a ground line PE' of the grid, respectively, and the method comprises:

constructing a loop from the first power line L1 of the inverter device, the control ground line GND, the ground line PE' of the grid, the neutral line N' of the grid and the first power line L1 in sequence by use of the grid-connected switching unit, and obtaining the instantaneous voltage $u_{L1GND}$ by sampling with an inverter side voltage detecting circuit, or constructing a loop from the second power line L2 of the inverter device, the control ground line GND, the ground line PE' of the grid, the neutral line N' of the grid and the second power line L2 in sequence by use of the grid-connected switching unit, and obtaining the instantaneous voltage $u_{L2GND}$ by sampling with an inverter side voltage detecting circuit; and identifying whether the grid is a first type or a second type of grid based on at least one of the instantaneous voltage $u_{L1GND}$ and the instantaneous voltage $u_{L2GND}$.

16. The method for identifying the type of a grid automatically according to claim 15, wherein the grid-connected switching unit comprises at least a relay disposed on at least one of the first power line L1 and the second power line L2 of the inverter device.

17. The method for identifying the type of a grid automatically according to claim 16, wherein the grid-connected switching unit comprises two relays disposed on the first power line L1 and the second power line L2, respectively; and, the first loop is constructed by closing the relay on the first power line L1 and disconnecting the relay on the second power line L2; or the second loop is constructed by closing the relay on the second power line L2 and disconnecting the relay on the first power line L1.

18. The method for identifying the type of a grid automatically according to claim 17, further comprising:

sampling the instantaneous voltage $U_{L1GND}$ or the instantaneous voltage $U_{L2GND}$ by an inverter side voltage detecting circuit, with reference of an instantaneous voltage $u_{L1L2}$ between the first power line L1 and the second power line L2 at zero crossing point that is measured by a grid side voltage detecting circuit; wherein, the grid is the first type grid when the instantaneous voltage $u_{L1GND}$ satisfies $|u_{L1GND}|>C$ or the instantaneous voltage $U_{L2GND}$ satisfies $|u_{L2GND}|>C$, otherwise is the second type grid, wherein the first type grid is a 208V grid, the second type grid is a 240V grid, and C is a threshold.

* * * * *